United States Patent [19]
Miyazaki et al.

[11] Patent Number: 5,582,414
[45] Date of Patent: *Dec. 10, 1996

[54] SLIDING MEMBER AND METHOD FOR MANUFACTURING THE SAME

[75] Inventors: Satomichi Miyazaki, Okaya; Nobuyuki Yamashita; Shoji Tanaka, both of Shiojiri; Hiroto Fukutome, Okaya; Hiroshi Tamagaki, Kobe, all of Japan

[73] Assignee: Teikoku Piston Ring Co., Ltd., Tokyo, Japan

[ * ] Notice: The term of this patent shall not extend beyond the expiration date of Pat. No. 5,449,547.

[21] Appl. No.: 253,922

[22] Filed: Jun. 3, 1994

[30] Foreign Application Priority Data

Jun. 7, 1993 [JP] Japan .................................. 5-163185

[51] Int. Cl.⁶ ...................... F16J 15/00; B32B 9/00
[52] U.S. Cl. ..................... 277/235 A; 428/472; 428/698
[58] Field of Search .................... 277/235 A, 227, 277/229, 235 R; 428/698, 472, 469

[56] References Cited

U.S. PATENT DOCUMENTS

| 3,770,286 | 11/1973 | Angilella et al. | 277/235 A |
| 4,486,285 | 12/1984 | Aubert et al. | |
| 4,876,150 | 10/1989 | Onuki et al. | 277/235 A |
| 5,316,321 | 5/1994 | Ishida et al. | 277/235 A |
| 5,405,154 | 4/1995 | Tsuchiya et al. | 277/235 A |

FOREIGN PATENT DOCUMENTS

| 57-57868 | 4/1982 | Japan . | |
| 60-224773 | 11/1985 | Japan . | |
| 62-83461 | 4/1987 | Japan . | |
| 1-41650 | 2/1989 | Japan | 277/235 A |
| 1-22922 | 7/1989 | Japan . | |
| 1-33658 | 7/1989 | Japan . | |
| 2154864 | 6/1990 | Japan | 277/235 A |
| 4-368 | 1/1992 | Japan . | |
| 6-81952 | 3/1994 | Japan . | |

*Primary Examiner*—Daniel G. DePumpo
*Attorney, Agent, or Firm*—Armstrong, Westerman, Hattori, Mcleland & Naughton

[57] ABSTRACT

An under coating 2 and a hard film 3 are formed on the outer circumferential surface of a piston ring 1 by an ion plating process. The under coating 2 is composed of at least one of Cr, $Cr_2N$, and CrN. The hard film 3 is composed of a hard coating material containing 3 percent to 20 percent by weight of oxygen in a solid solution state in a crystal structure of CrN and having the Vickers hardness of 1600 to 2200.

9 Claims, 9 Drawing Sheets

SLIDING MEMBER AND METHOD FOR MANUFACTURING THE SAME

BACKGROUND OF THE INVENTION

1. Field of the Invention

This invention relates to sliding members such as piston rings used in internal combustion engines and methods for manufacturing the same.

2. Description of the Related Art

In recent years piston rings have been subject to harsh operating environments due to demands for increased engine output and reduced exhaust gas emissions. Many engines using present methods such as hard chromium plating and nitriding treatment for surface processing of sliding surfaces, are not durable enough to withstand this harsh environment. A hard film of materials such as TiN and CrN using a physical vapor deposition process has been proposed. A thick film of CrN in particular has been employed to meet demands for engines with increased durability.

The CrN film shows superior wear resistance and scuffing resistance. This film is easy to mass produce and is available in films exceeding 30 µm. However since the CrN film is brittle, excessive repetitive stress on the sliding surfaces during operation generates cracks, which may cause peeling.

Accordingly, the applicant previously proposed a hard coating material having improved the sliding characteristics and toughness of CrN, and a sliding member covered with the hard coating material (see U.S. patent application Ser. No. 08/207,049, now U.S. Pat. No. 5,449,547).

This hard coating material is characterized in that 3 percent to 20 percent by weight of oxygen is contained in a solid solution state in a crystal structure of CrN and the Vickers hardness of the hard coating material is in the range of 1600 to 2200. The surfaces of the sliding member covered with the hard film composed of the hard coating material have improved scuffing resistance and toughness. Application of the hard coating material can be performed by an ion plating process.

However, since nitrogen gas and oxygen gas are used as process gases in ion plating, the base material surface of the sliding member becomes oxidized by the oxygen gas. As a result, the adhesion between the base material surface and the hard film may weaken.

SUMMARY OF THE INVENTION

It is an object of this invention to provide a sliding member with a hard film having improved sliding characteristics and toughness of CrN film on at least the sliding surface, with good adhesion to the base material surface, and a manufacturing method therefor.

A sliding member of this invention has an under coating formed on at least a sliding surface of the sliding member and a hard film formed on said under coating, said under coating being composed of at least one of Cr (chromium), $Cr_2N$ (dichromium nitride), and CrN (chromium nitride), said hard film being composed of a hard coating material containing 3 percent to 20 percent by weight of oxygen in a solid solution state in a crystal structure of CrN and having the Vickers hardness of 1600 to 2200.

A method for manufacturing a sliding member of this invention comprises the steps of forming an under coating on at least a sliding surface of the sliding member by an ion plating process using chromium metal for an evaporating source, and forming a hard film on said under coating by an ion plating process using chromium metal for the evaporating source and using nitrogen gas and oxygen gas as process gases.

The ion plating process for forming the under coating may be performed without a process gas, or with nitrogen gas as a process gas.

And when the ion plating process for forming the under coating uses nitrogen gas as the process gas, the ion plating process may comprise a process that performs ion plating without supplying nitrogen gas into the ion plating atmosphere and a process that performs ion plating with nitrogen gas supplied into the ion plating atmosphere. Ion plating may also be done under various gas pressures by varying pressure of nitrogen gas in the ion plating atmosphere.

According to these means, the hard film can have improved scuffing resistance and toughness, since the hard film is composed of a hard coating material containing prescribed amounts of oxygen in a solid solution state in the CrN.

Since the under coating is placed beneath the hard film, the base material surface of the sliding member can be prevented from being oxidized by oxygen gas used during application of the hard film in the ion plating process. As a result, the hard film can have good adhesion to the sliding member. For these reasons, the sliding member of this invention can have superior durability.

BRIEF DESCRIPTION OF THE DRAWINGS

The aforesaid and other objects and features of the present invention will become more apparent from the following detailed description and the accompanying drawings.

DESCRIPTION OF THE PREFERRED EMBODIMENTS

Figure 1:
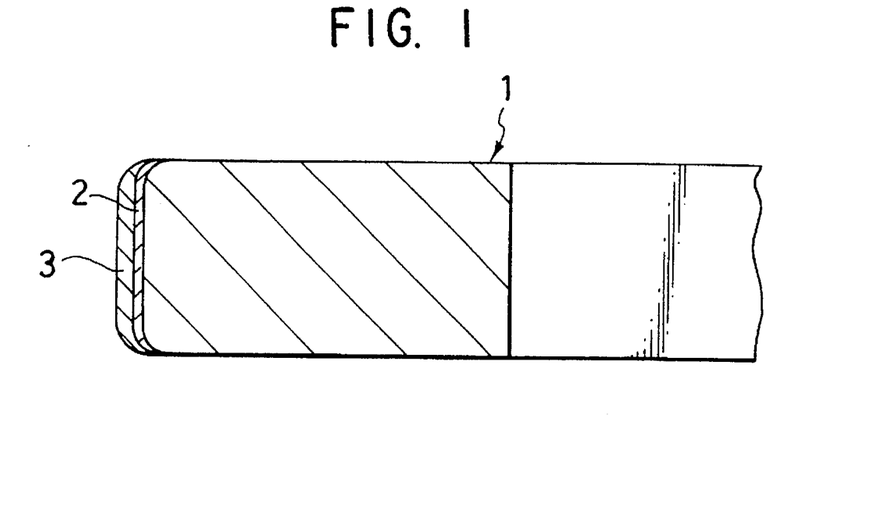
FIG. 1 is a longitudinal sectional view showing a part of a piston ring of one preferred embodiment of the present invention.

FIG. 1 shows a piston ring 1 having a rectangular cross section. The piston ring 1 is made of steel, cast iron, titanium or titanium alloy and the like. The outer circumferential surface of the piston ring 1 is covered with an under coating 2 and a hard film 3 by an arc ion plating process.

The under coating 2 is one of the following films indicated below.

(1) Cr film (2) $Cr_2N$ film (3) CrN film (4) Film composed of Cr and $Cr_2N$ (5) Film composed of $Cr_2N$ and CrN The under coating 2 prevents the base material surface from being oxidized by oxygen gas used during application of the hard film 3 in an ion plating process. There are no particular restrictions on the thickness of the under coating 2, but a thickness within a range of 0.1 μm to 15 μm is preferable.

The hard film 3 is composed of a hard coating material containing 3 percent to 20 percent by weight of oxygen in a solid solution state in a crystal structure of CrN and having the Vickers hardness of 1600 to 2200. The thickness of the hard film 3 is preferably in a range of 10 μm to 70 μm.

The arc ion plating process is one type of ion plating, wherein a film material of the evaporating source (cathode) is vaporized, ionized by vacuum arc discharge to form a film on the surface of the substrate. This arc ion plating process is characterized by a high ionization rate of the vapor allowing forming of a highly adhesive, high density film.

Figure 2:
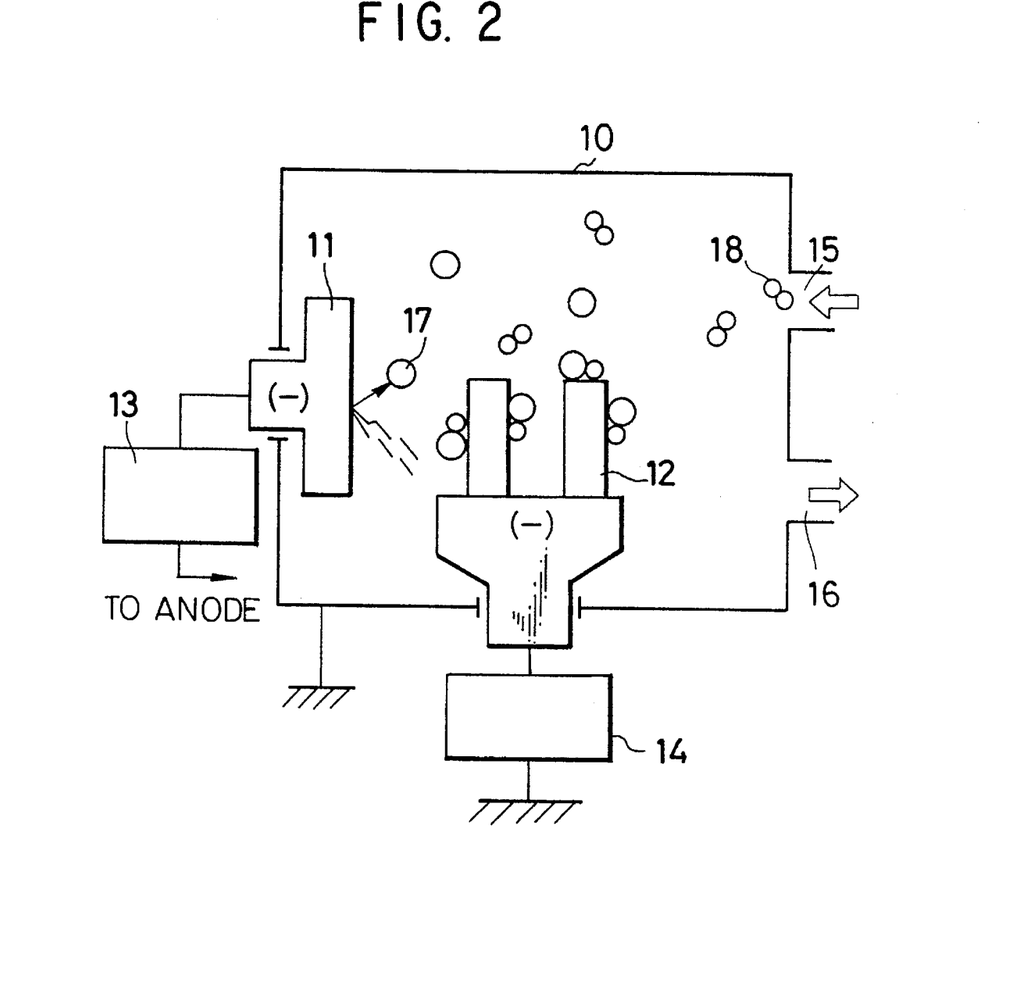
FIG. 2 is a view illustrating a configuration of an arc ion plating apparatus.

A basic configuration of an arc ion plating apparatus will be described with reference to FIG. 2. A cathode (evaporating source) 11 composed of a film material and a substrate 12 on which film is formed, are mounted in a vacuum chamber 10. The cathode 11 is connected to an arc supply source 13 installed outside the vacuum chamber 10, and an anode not shown in the figure is connected to the arc supply source 13. A negative bias voltage is applied to the substrate 12 by a bias voltage supply source 14. The vacuum chamber 10 is provided with a gas inlet 15 connected to process gas supply source and a discharging outlet 16 connected to a pump.

Accordingly, at the start of arc discharge between the cathode 11 and the anode in the vacuum chamber 10, the arc concentrates into a point (arc spot) on the surface of the cathode 11, and moves around randomly and fast on the surface of the cathode 11. The energy of the arc current (several tens of amperes to several hundreds of amperes) concentrated in the arc spot instantaneously evaporates and ionizes the material of the cathode 11 to generate metallic ions 17 released into the vacuum space. Then, a negative bias voltage which is applied to the substrate 12 accelerates the metallic ions 17 to tightly adhere together with reactive gases 18 on the surface of the substrate 12, producing an extremely fine coating.

The arc ion plating apparatus described above can be used to form the under coating 2 on the piston ring.

When the under coating 2 is applied by ion plating, the surface of the piston ring is cleaned prior to the ion plating. That is, the piston ring as the substrate 12 is heated to approximately 400° C. by a heater (not shown) provided in the vacuum chamber 10. Metal ion bombardment is then carried out for several minutes at a bias voltage of 600 volts to 1000 volts to remove the oxide film on the surface of the piston ring. At this time, the temperature of the piston ring climbs to approximately 600° C. Afterwards when the bias voltage is gradually reduced, deposition begins from about the 300 volt level.

When the under coating 2 is $Cr_2N$ film, CrN film, film composed of Cr and $Cr_2N$, or film composed of $Cr_2N$ and CrN, the under coating 2 can be formed using chromium metal for the cathode material and using nitrogen gas as the process gas in the ion plating.

Composition of the under coating 2 can be changed according to the pressure of nitrogen gas in the vacuum chamber 10. Types of the under coating are listed below. The under coating becomes the lower type as the pressure of the nitrogen gas becomes greater.

Film composed of Cr and $Cr_2N$

↓

Film composed of $Cr_2N$ and CrN (The percentage of $Cr_2N$ is greater than the percentage of CrN.)

↓

Film composed of CrN and $Cr_2N$ (The percentage of CrN is greater than the percentage of $Cr_2N$.)

↓

CrN film

The relation between the pressure of nitrogen gas and the composition of the under coating 2 is shown in Table 1. In Table 1, the unit of the pressure of nitrogen gas is given in mTorr, and the unit of bias voltage is given in volt. The number written below the under coating in Table 1 shows the Vickers hardness of the under coating.

TABLE 1

| | | Bias voltage | | | | | |
|---|---|---|---|---|---|---|---|
| | | 0 | 2 | 3 | 5 | 10 | 30 |
| Pressure of nitrogen gas | 1 | $Cr_2N$ 1627 | — | — | — | — | Cr2N 1820 |
| | 3 | — | — | — | — | — | $Cr_2N$ + CrN 1845 |
| | 5 | — | — | — | — | — | CrN + $Cr_2N$ 1900 |
| | 10 | CrN 1125 | CrN 1192 | CrN 1258 | CrN 1317 | CrN 1355 | CrN 1654 |
| | 15 | CrN 946 | CrN 1030 | CrN 1103 | CrN 1111 | CrN 1251 | CrN 1582 |
| | 20 | CrN 853 | CrN 942 | CrN 1035 | CrN 1098 | CrN 1157 | CrN 1441 |
| | 30 | CrN 428 | CrN 492 | CrN 625 | CrN 754 | CrN 886 | CrN 1173 |

When the under coating 2 is a Cr film, ion plating is carried out using chromium metal for the cathode material without using process gas.

After a prescribed thickness of the under coating 2 is formed on the piston ring, ion plating is carried out with nitrogen gas and oxygen gas supplied as process gases into the vacuum chamber 10 of the arc ion plating apparatus, thereby a hard film composed of a hard coating material containing oxygen in a solid solution state in CrN can be formed on the under coating of the piston ring.

Control of the oxygen concentration can be performed by adjusting the partial pressure of oxygen in the ion plating process. As the partial pressure of oxygen is raised, the oxygen concentration increases.

Control of the hardness of the hard film composed of a hard coating material containing oxygen in a solid solution state in CrN can be performed by adjusting the partial pressure of oxygen and adjusting the bias voltage in the ion plating process. As the partial pressure of oxygen is raised, the film hardness increases (see Table 2). In addition, as the bias voltage is raised, the film hardness increases (see Table 3).

TABLE 2

| Bias voltage: 5 V | |
|---|---|
| Concentration of oxygen (%) | Hardness of hard film ($HV_{0.1}$) |
| 7.3 | 1838 |
| 10.0 | 2059 |
| 13.3 | 2131 |

TABLE 3

| Concentration of oxygen: 7.3% | |
|---|---|
| Bias voltage (V) | Hardness of hard film ($HV_{0.1}$) |
| 3 | 1776 |
| 5 | 1838 |
| 10 | 1854 |

Figure 3A:
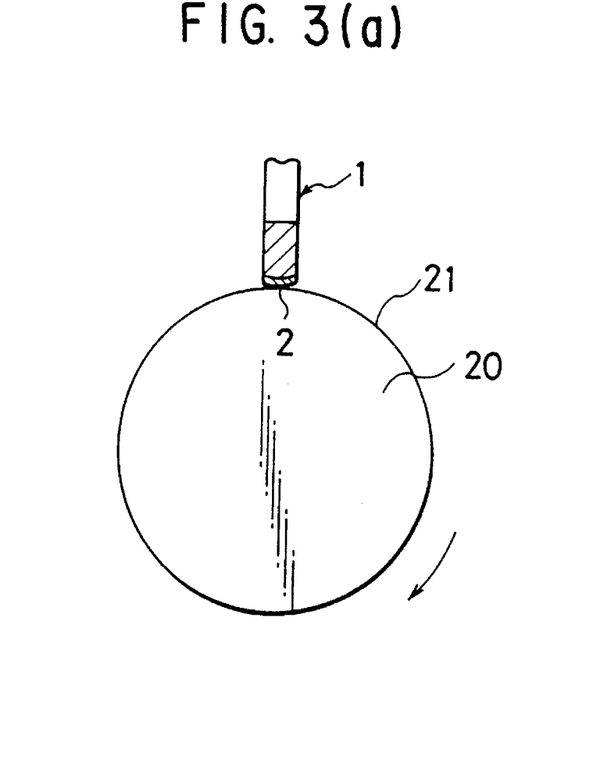
FIG. 3(a) is a front elevational view partly in section showing an outline of a pin-on-cylinder friction testing machine.
Figure 3B:
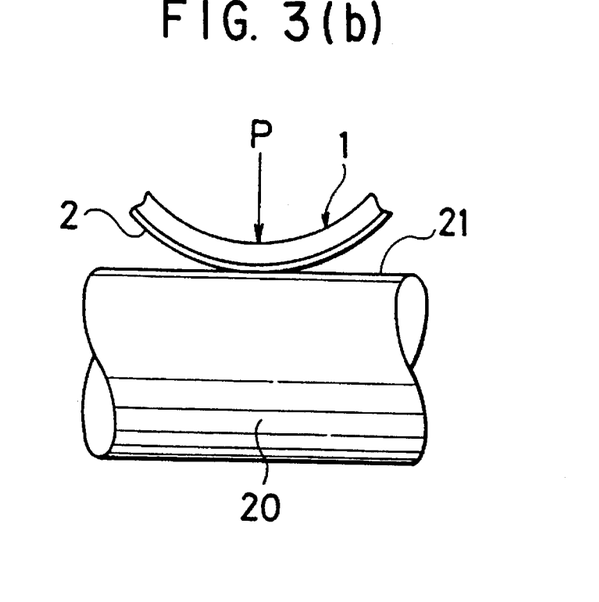
FIG. 3(b) is a side elevational view of FIG. 3(a).

In order to evaluate the toughness of the aforesaid hard film 3 composed of a hard coating material containing oxygen in a solid solution state in CrN, a pin-on-cylinder friction testing machine was used to perform a film toughness evaluation test. An outline of the test using the Pin-on-cylinder friction testing machine will be described with reference to FIG. 3.

The piston ring 1 is arranged along an axis of a rotor 20 at the upper end of the outer circumferential surface 21 of the rotor 20 (cast iron material: JIS FC 250) rotated around the horizontal axis. A load P is applied to the piston ring 1 to push the piston ring 1 against the outer circumferential surface 21 of the rotor 20. Under this state, the rotor 20 is rotated while lubricant oil is supplied to the contact portion between the piston ring 1 and the rotor 20.

Slide speed was measured when cracks occurred in the hard film 3 of the piston ring 1 when the speed of the rotor 20 was varied. Measurement was performed for eight kinds of piston rings (4 kinds of piston rings of the present invention and 4 kinds of piston rings for comparison) having different amounts of oxygen in the hard film. The thickness of the hard film of the piston ring used in the measurement was 50 μm and surface roughness of the film was 0.6 μmRz. The under coating was a CrN film and the thickness of the under coating was 7.6 μm.

Measurement of oxygen in the hard film was mainly performed by EPMA (electron probe microanalyzer) and confirmed by ESCA (electron spectroscopy for chemical analysis).

Test conditions were as follows.
Lubricant oil: Hi-Diesel S3 10W Engine Oil (NIPPON OIL CO., LTD.)
Load (P): 5 pounds
Slide Speed: Varied in a range of 0 m/s to 7 m/s
Temperature: Room temperature Table 4 indicates the results of the test and a graph of the same results is given in FIG. 4.

TABLE 4

| Oxygen content of hard film (wt. %) | Slide speed when cracks occurred in the hard film (m/s) |
|---|---|
| 0.0 | 3.5 |
| 0.9 | 5.0 |
| 2.9 | 5.5 |
| 4.4 | 7.0 or more |
| 8.5 | 7.0 or more |
| 10.4 | 7.0 or more |
| 15.7 | 7.0 or more |
| 23.0 | 5.0 |

No cracks occurred at a slide speed of 7 m/s for hard film oxygen contents of 4.4, 8.5, 10.4 and 15.7 percent.

Figure 4:
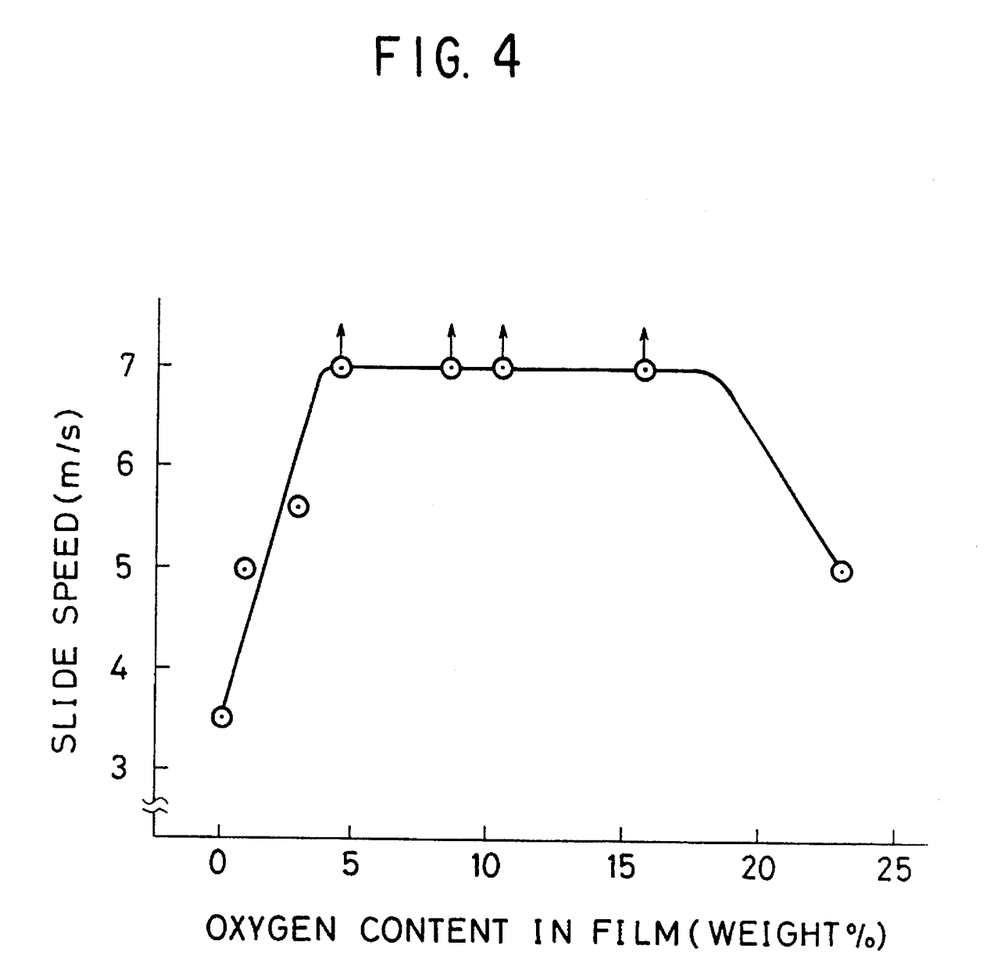
FIG. 4 is a graph illustrating the test results performed with a Pin-on-cylinder friction testing machine.

As indicated by the test results in FIG. 4, toughness of the film during sliding was found to be improved by containing oxygen in the CrN.

Figure 5:
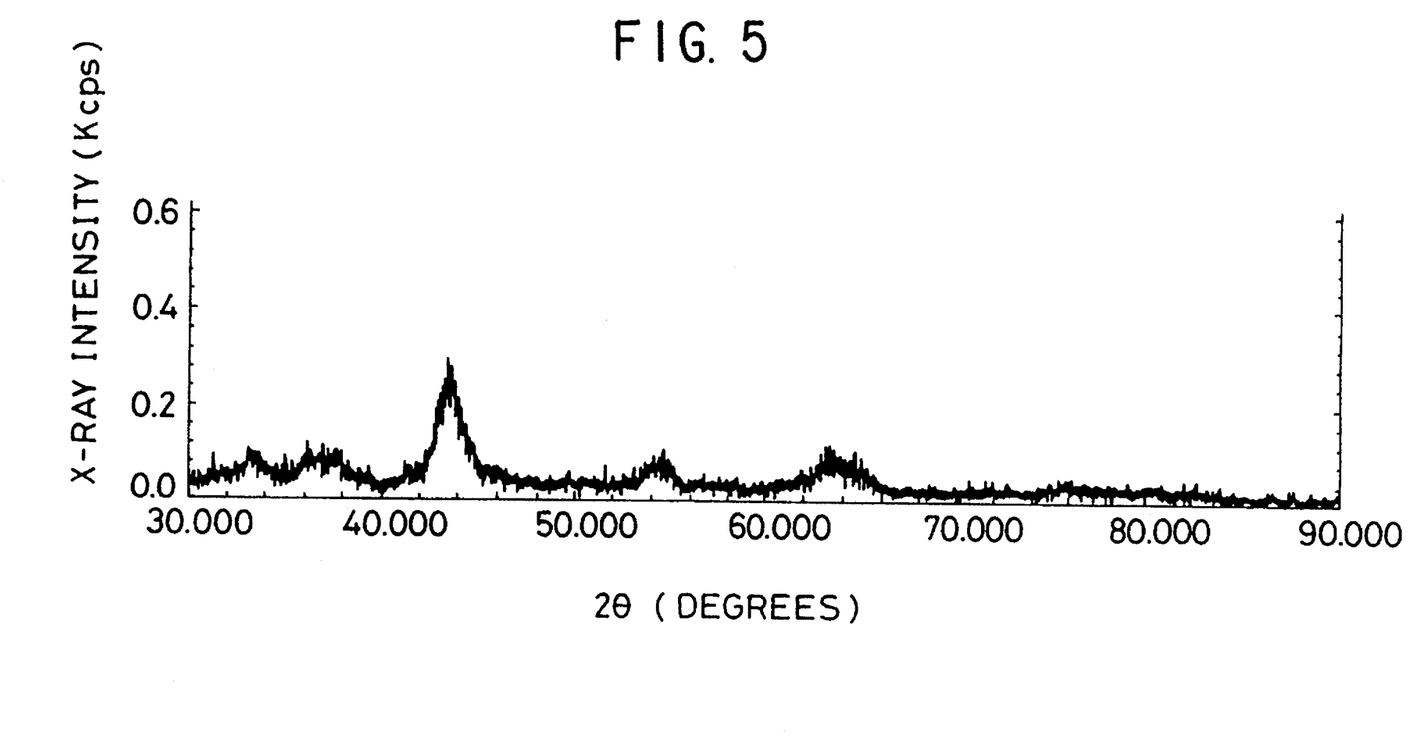
FIG. 5 is an X-ray diffraction pattern of the hard film composed of a hard coating material containing 23 percent by weight of oxygen in a solid solution state in a crystal structure of CrN.
Figure 6:
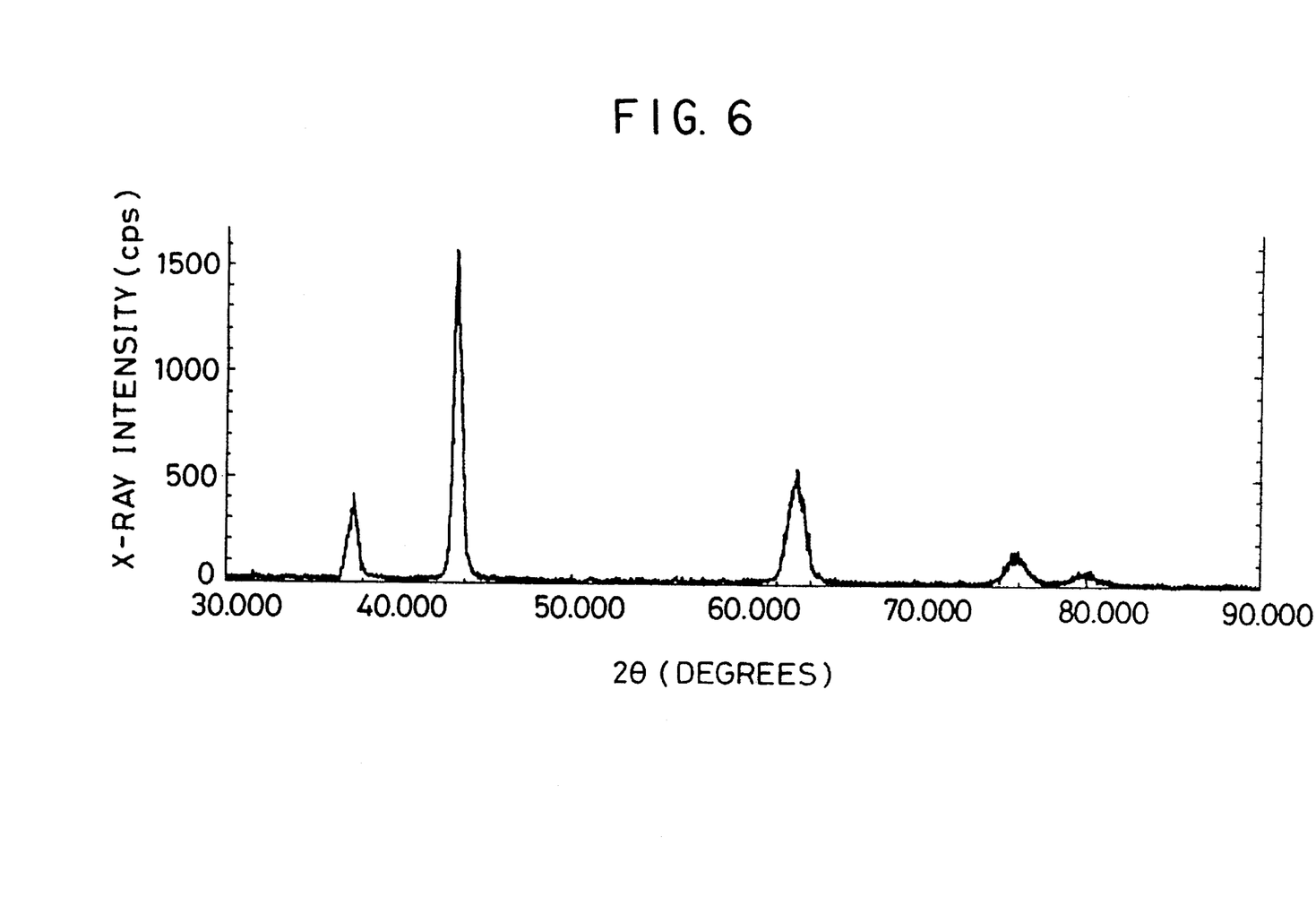
FIG. 6 is an X-ray diffraction pattern of the hard film composed of a hard coating material containing 10 percent by weight of oxygen in a solid solution state in a crystal structure of CrN.

In order to maintain sufficient toughness in the hard film in the preferred embodiment, the oxygen content in the CrN was set at 3.0 percent or more by weight. As shown in FIG. 5, when the oxygen content was 23 percent or more by weight, the appearance of peaks for $Cr_2O_3$ (dichromium trioxide) as well as for CrN in the X-ray diffraction pattern (X-ray tube: copper) showed deterioration in film toughness. Therefore, an oxygen upper limit of 20 percent by weight was set. FIG. 6 indicates the X-ray diffraction pattern (X-ray tube: copper) when the oxygen content was 10 percent by weight, and diffraction peaks for $Cr_2O_3$ do not appear. CrN has a NaCl type crystal structure. $Cr_2O_3$ has an orthorhombic crystal structure.

The hard film composed of a hard coating material containing oxygen in a solid solution state in CrN is not high-density and contains defects such as pits, with a hardness lower than HV 1600. Since peeling may occur in the manufacturing process at a hardness in excess of HV 2200, film hardness was set within the Vickers hardness range of 1600 to 2200.

Next, in order to evaluate the scuffing characteristics of the hard film composed of a hard coating material containing oxygen in a solid solution state in CrN, a high surface pressure scuffing testing machine was used. An outline of the test using the high surface pressure scuffing testing machine will be described with reference to FIG. 7.

Figure 7:
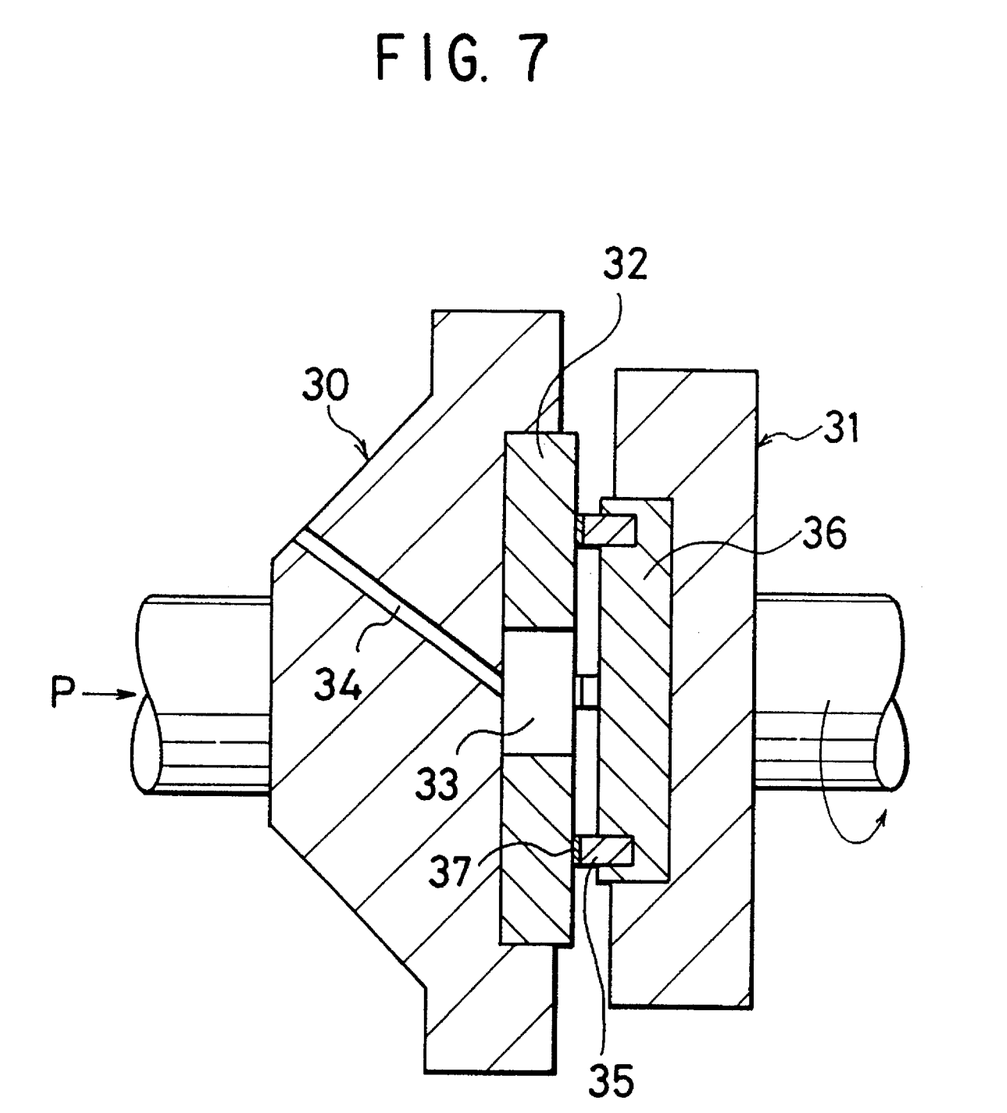
FIG. 7 is a longitudinal sectional view showing an outline of a high surface pressure scuffing testing machine.

A stator 30 has a circular concave part at a surface facing a rotor 31 to be described later. A disk 32 (cast iron material: JIS FC 250) is fixed to the concave part. The disk 32 is projected toward the rotor 31. The surface of the disk 32, facing the rotor 31 forms a vertical flat surface. The disk 32 has an oil hole 33 at its central part in the axial direction of the stator 30. The stator 30 has an oil hole 34 communicated with the oil hole 33 in a slant direction. Lubricant oil is supplied to the contact portions between the disk 32 of the stator 30 and pins 35 to be described later, through these oil holes 33 and 34.

The rotor 31 is rotated around the horizontal axis and has a circular concave part at the surface facing the stator 30. A pin holder 36 is concentrically fixed to the rotor 31 at the concave part. At the surface of the pin holder 36 facing the stator 30 are formed four concave parts equally spaced apart on the same circle. Each of the pins 35 (8 mmφ) is inserted into these concave parts as test pieces, and fixed there. Each of the pins 35 is projected horizontally from the surface of the pin holder 36 toward the stator 30.

The projecting end surface of each of the pins 35 is formed with various kinds of surface treatment films 37 and their end surfaces are in contact With the surface of the disk 32 of the stator 30.

Accordingly, a load P is applied to the stator 30 to push the disk 32 against the pins 35. The rotor 31 is then rotated while lubricant oil is supplied to the contact portions between the pins 35 and the disk 32 through the oil holes 33 and 34.

When the load P was varied with the slide speed of the rotor 31 kept constant, the load when the pin 35 was scuffed was measured. Scuffing tests were performed under the following test conditons for pins (member for comparison) having, respectively, a hard chromium plating film, a nitrided layer of stainless steel, and a CrN film in which oxygen is not contained in CrN, and a pin (the present invention) provided with a CrN film formed on an under coating composed of $Cr_2N$ (film thickness: 5.0 μm), the CrN film containing oxygen in a solid solution state in the CrN.

Figure 8:
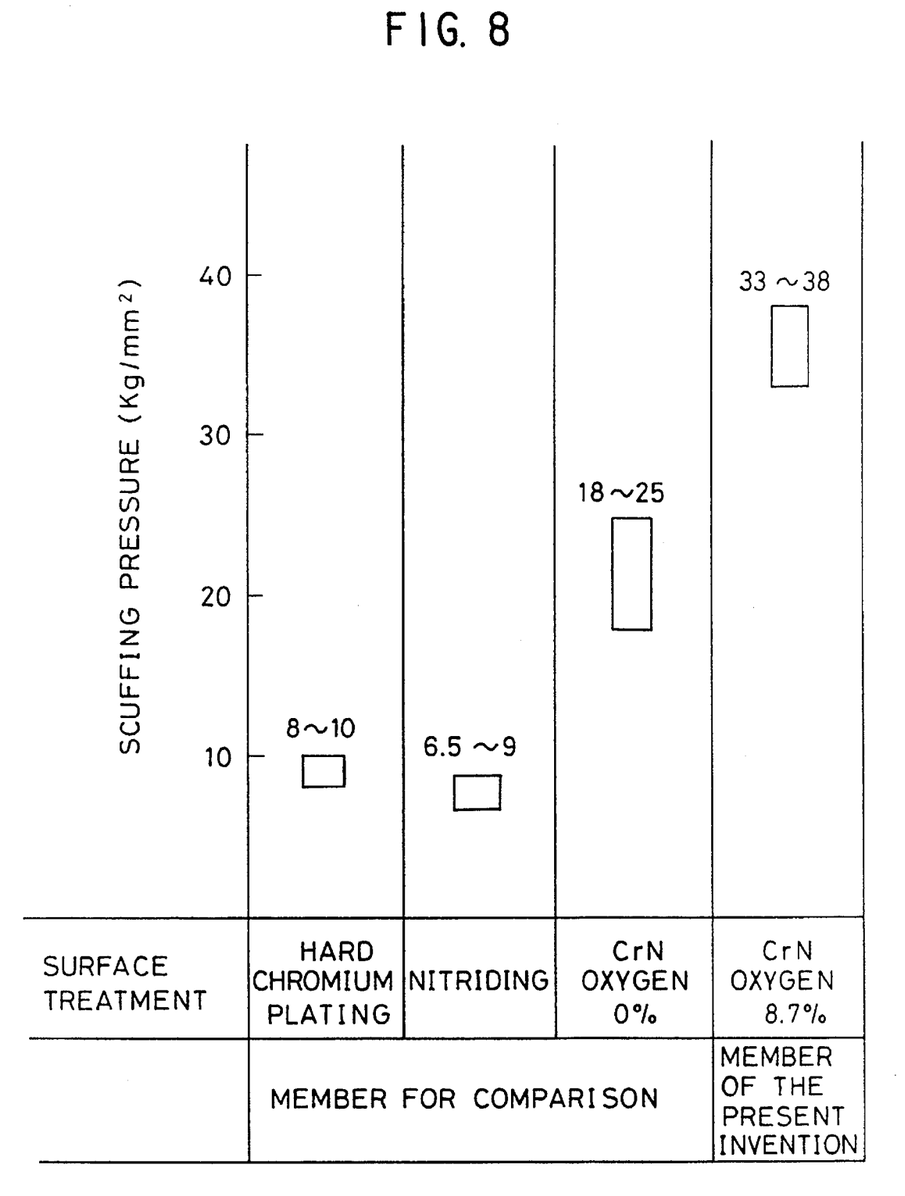
FIG. 8 is a graph illustrating the test results performed with a high surface pressure scuffing testing machine.

The test conditions were as follows.
Lubricant oil: Hi-Diesel S3 10W Engine oil (NIPPON OIL CO., LTD.); Oil temperature 80° C.
Load (P): Increased by 10 kgf from an initial load of 20 kgf at a time interval of 3 minutes
Slide speed: 8 m/s constant
Temperature: Room temperature As indicated by the test results in FIG. 8, it is apparent that the CrN film is superior to the hard chromium plating film or the nitrided layer in scuffing resistance. In addition, it is apparent that of the CrN film, the film of the present invention containing oxygen in a solid solution state in CrN is superior in scuffing resistance, to the film containing no oxygen.

Next, the adhesion of the hard film composed of a hard coating material containing oxygen in a solid solution state in CrN, was evaluated with the indentation test.

The indenter and load applied onto the outer circumferential surface of the piston ring are as follows.
Indenter: Diamond of cone angle of 120 degrees
Load: 60 kg, 100 kg, 150 kg The hard film composed of a hard coating material containing oxygen in a solid solution state in CrN, is as follows:
ion plating conditions: bias voltage 5 volts Oxygen in atmosphere 10.0%
film thickness: 50 μm
film hardness: $HV_{0.1}$ 2059
Oxygen content in film: 11.3%

Figure 9A:
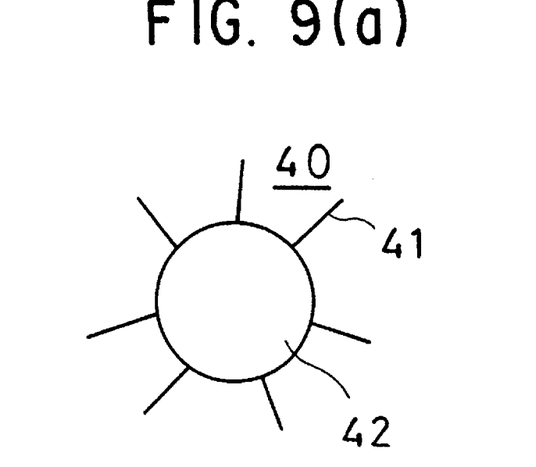
FIG. 9(a) is a view illustrating the occurrence of cracks in the outer circumferential surface of the piston ring in the adhesion test performed by the indentation test.
Figure 9B:
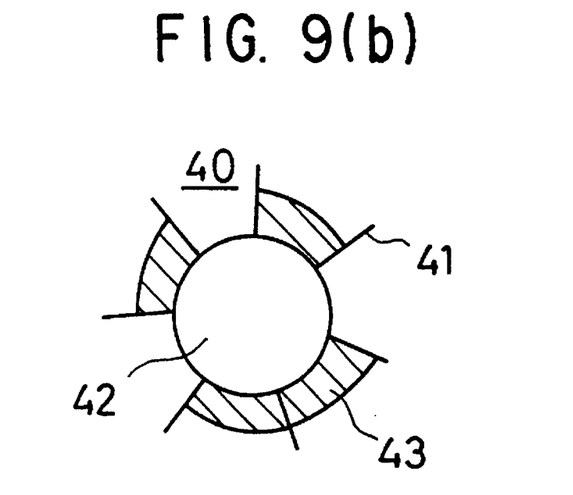
FIG. 9(b) is a view illustrating the occurrence of cracks and peelings in the outer circumferential surface of the piston ring in the adhesion test performed by the indentation test.

Table 5 shows the results of the adhesion test of the above hard film with and without the under coating. In Table 5, the "O" mark denotes that cracks 41 have occurred in an outer circumferential surface 40 of the piston ring (refer to FIG. 9(a)) and the "X" mark denotes that along with the cracks 41 occurring in the outer circumferential surface 40 of the piston ring, peelings also (43 denotes peeling portion) have occurred on the periphery of an indentation 42 (refer to FIG. 9 (b)).

TABLE 5

| Under coating | | Load (kg) | | |
|---|---|---|---|---|
| Type | Thickness(μm) | 60 | 100 | 150 |
| No coating | — | O | X | X |
| CrN | 0.5 | O | O | O |
| CrN | 7.6 | O | O | O |
| CrN | 10.0 | O | O | O |

TABLE 5-continued

| Under coating | | Load (kg) | | |
|---|---|---|---|---|
| Type | Thickness(μm) | 60 | 100 | 150 |
| $Cr_2N$ | 3.4 | O | O | O |
| Cr | 1.6 | O | O | O |

Figure 10:
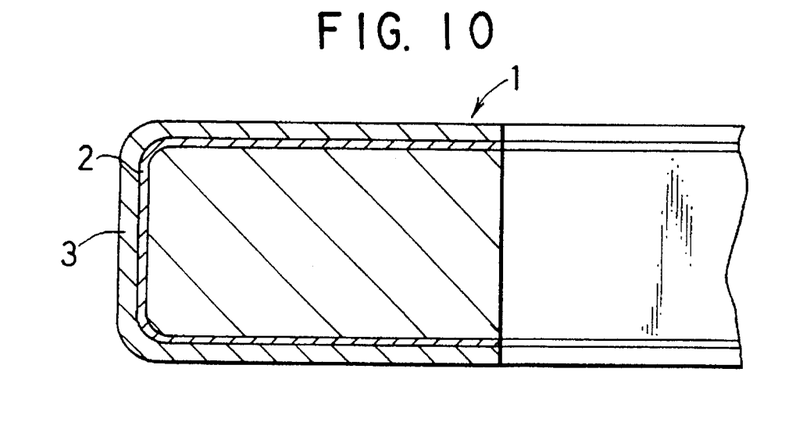
FIG. 10 is a longitudinal sectional view showing a part of a piston ring of another preferred embodiment of the present invention.

FIG. 10 is a longitudinal sectional view showing a part of a piston ring of another embodiment of the present invention. A piston ring 1 of this embodiment differs from the piston ring shown in FIG. 1, only in the portions covered with the under coating and the hard film. The under coating 2 and the hard film 3 are formed on the outer circumferential surface and the upper and lower surfaces of the piston ring 1, by an arc ion plating process.

Figure 11:
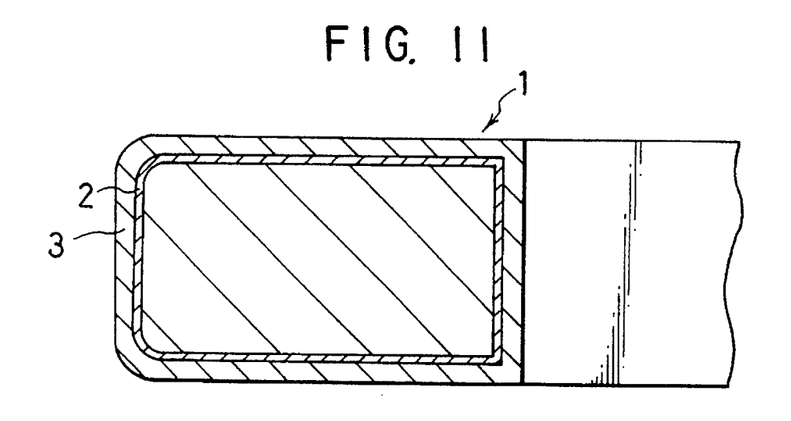
FIG. 11 is a longitudinal sectional view showing a part of a piston ring of another preferred embodiment of the present invention.

FIG. 11 shows a longitudinal sectional view of a part of a piston ring of another embodiment of the present invention. A piston ring 1 of this embodiment differs from the piston ring shown in FIG. 1, only in the portions covered with the under coating and the hard film. The under coating 2 and the hard film 3 are formed on the outer circumferential surface, the upper and lower surfaces, and the inner circumferential surface of the piston ring 1, by an arc ion plating process.

Figure 12:
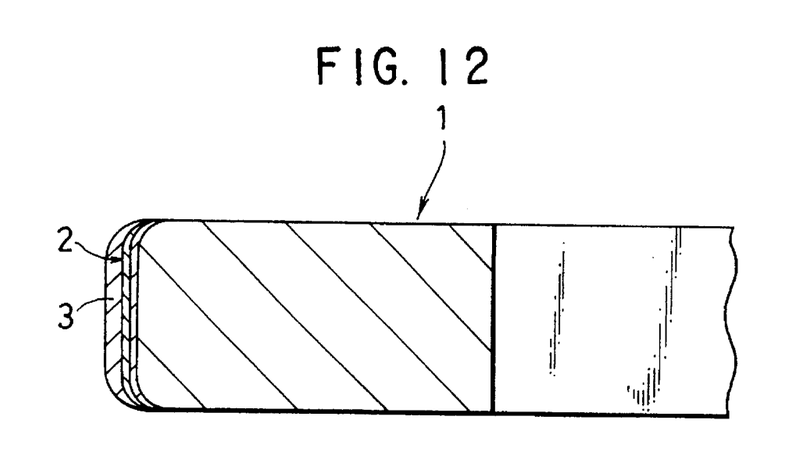
FIG. 12 is a longitudinal sectional view showing a part of a piston ring of still another preferred embodiment of the present invention.

FIG. 12 shows a longitudinal sectional view of a part of a piston ring of still another embodiment of the present invention. A piston ring 1 of this embodiment differs from the piston ring shown in FIG. 1, only in the structure of the under coating. The under coating 2 of the piston ring of this embodiment has a two-layer structure. This under coating 2 is a two-layer film cosisting of any two of the following films; Cr film, $Cr_2N$ film, CrN film, film composed of Cr and $Cr_2N$, and film composed of $Cr_2N$ and CrN.

The under coating 2 can be applied with the arc ion plating apparatus, using chromium metal for the cathode material and using nitrogen gas as a process gas. The Cr film can be applied by the ion plating process without supplying nitrogen gas into the vacuum chamber 10. The other types of films can be applied under a specific pressure of nitrogen gas supplied into the vacuum chamber 10.

Accordingly, both a Cr film and another film ($Cr_2N$ film, CrN film, film composed of Cr and $Cr_2N$, or film composed of $Cr_2N$ and CrN) can be applied as described in the following (1) or (2).

(1) First, ion plating is carried out without supplying nitrogen gas into the vacuum chamber 10. Next, ion plating is carried out with nitrogen gas supplied into the vacuum chamber 10. In that case, the base material surface is covered with a Cr film, and another film ($Cr_2N$ film, CrN film, film composed of Cr and $Cr_2N$, or film composed of $Cr_2N$ and CrN) is applied on the Cr film.

(2) First, ion plating is carried out with nitrogen gas supplied into the vacuum chamber 10. Next, ion plating is carried out with the nitrogen gas evacuated from the vacuum chamber 10. In that case, the base material surface is covered with a film ($Cr_2N$ film, CrN film, film composed of Cr and $Cr_2N$, or film composed of $Cr_2N$ and CrN), and a Cr film is applied on said film.

A film consisting of a combination of any two of $Cr_2N$ film, CrN film, film composed of Cr and $Cr_2N$, and film composed of $Cr_2N$ and CrN can be formed as described below.

Ion plating is carried out under a specific pressure of nitrogen gas supplied into the vacuum chamber 10, and is then carried out with the pressure of nitrogen gas in the vacuum chamber 10 varied, to form a different film. By varying the pressure of the nitrogen gas, different film types can be formed as previously related.

While the under coating shown in FIG. 12 is a two-layer film, the under coating may also consist of a three or more-layer film.

While FIG. 12 shows an example in which the under coating and the hard film are formed on the outer circumferential surface of the piston ring, the under coating and the hard film may also cover the outer circumferential surface, and the upper and lower surfaces; or the outer circumferential surface, the upper and lower surfaces and the inner circumferential surface.

In the aforesaid preferred embodiments, although the under coating and the hard film are applied to the piston ring, these films are not limited to piston ring applications. These films may be applied to cover at least the sliding surface of other sliding members, for example, a tappet or a cam used as a valve driving member in an internal combustion engine.

Although the present invention has been described with reference to the preferred embodiments, it is apparent that the present invention is not limited to the aforsaid preferred embodiments, but various modifications can be attained without departing from its scope.

What is claimed is:

1. A sliding member made of steel or cast iron having an under coating formed on at least a sliding surface of the sliding member and a hard film formed on said under coating, said under coating comprising at least one member selected from the group consisting of (a) $Cr_2N$, (b) CrN, (c) Cr and $Cr_2N$, and (d) $Cr_2N$ and CrN, said hard film comprising a hard coating material containing 3 percent to 20 percent by weight of oxygen in a solid solution state in a crystal structure of CrN and having the Vickers hardness of 1600 to 2200.

2. A sliding member according to claim 1 wherein said under coating is a $Cr_2N$ film.

3. A sliding member according to claim 1 wherein said under coating is a CrN film.

4. A sliding member according to claim 1 wherein said under coating is a film comprising Cr and $Cr_2N$.

5. A sliding member according to claim 1 wherein said under coating is a film comprising $Cr_2N$ and CrN.

6. A sliding member according to claim 1 wherein said under coating is a multi-layer film consisting of two or more films selected from the group consisting of $Cr_2N$ film, CrN film, film comprising Cr and $Cr_2N$, and film comprising $Cr_2N$ and CrN.

7. A sliding member according to claim 1, 2, 3, 4, 5, or 6, wherein the member to which said films have been applied is a piston ring, and the surface where said films are formed is an outer circumferential surface of the piston ring.

8. A sliding member according to claim 1, 2, 3, 4, 5, or 6, wherein the member to which said films have been applied is a piston ring, and the surfaces where said films are formed are an outer circumferential surface, an upper surface and a lower surface of the piston ring.

9. A sliding member according to claim 1, 2, 3, 4, 5, or 6, wherein the member to which said films have been applied is a piston ring, and the surfaces where said films are formed are an outer circumferential surface, an upper surface, a lower surface and an inner circumferential surface of the piston ring.

* * * * *